(12) United States Patent
Chia et al.

(10) Patent No.: US 12,075,588 B2
(45) Date of Patent: Aug. 27, 2024

(54) EJECTOR FOR FIELD REPLACEABLE MODULE

(71) Applicant: Cisco Technology, Inc., San Jose, CA (US)

(72) Inventors: Vic Hong Chia, Sunnyvale, CA (US); Wei Qi, Shanghai (NC)

(73) Assignee: Cisco Technology, Inc.

( * ) Notice: Subject to any disclaimer, the term of this patent is extended or adjusted under 35 U.S.C. 154(b) by 469 days.

(21) Appl. No.: 17/520,181

(22) Filed: Nov. 5, 2021

(65) Prior Publication Data

US 2023/0144465 A1 May 11, 2023

(51) Int. Cl.
H05K 7/14 (2006.01)

(52) U.S. Cl.
CPC ......... H05K 7/1411 (2013.01); H05K 7/1402 (2013.01); H05K 7/1409 (2013.01)

(58) Field of Classification Search
CPC ... H05K 7/1411; H05K 7/1402; H05K 7/1409
USPC .......................................................... 361/754
See application file for complete search history.

(56) References Cited

U.S. PATENT DOCUMENTS

| | | | | |
|---|---|---|---|---|
| 4,914,550 A * | 4/1990 | Filsinger | ............... | H05K 7/1409 439/372 |
| 6,381,146 B1 * | 4/2002 | Sevier | .................. | H05K 7/1411 361/740 |
| 6,961,249 B2 * | 11/2005 | Wong | .................... | H05K 7/1409 361/801 |
| 7,349,228 B1 * | 3/2008 | Ray | ....................... | H05K 7/1409 361/801 |
| 8,611,103 B2 * | 12/2013 | Thomas | ............... | H05K 7/1489 361/801 |
| 9,766,667 B1 | 9/2017 | Singer | | |
| 10,285,291 B1 * | 5/2019 | Lam | ..................... | H05K 7/1489 |
| 10,396,497 B1 * | 8/2019 | Bame | ................... | H05K 7/1409 |
| 2004/0077198 A1 * | 4/2004 | Schlack | ............... | H05K 7/1409 439/160 |
| 2007/0002550 A1 * | 1/2007 | Strmiska | .............. | H05K 7/1409 361/798 |
| 2009/0086456 A1 * | 4/2009 | Milo | .................... | H05K 7/1409 361/801 |
| 2013/0130528 A1 * | 5/2013 | Jun | ...................... | H05K 7/1409 439/160 |

(Continued)

FOREIGN PATENT DOCUMENTS

KR            101672188 B1    11/2016

*Primary Examiner* — Zhengfu J Feng
(74) *Attorney, Agent, or Firm* — Merchant & Gould P.C.

(57) ABSTRACT

An ejector may be provided. The ejector may comprise a pawl, a trigger, and a handle. The pawl may be configured to rotate relative to a line card about a first axis. The pawl may comprise a pawl concavity. The trigger may be configured to rotate relative to the line card about a second axis. The trigger may comprise a trigger catch and a trigger lever. The trigger catch may be configured to engage the pawl concavity. The handle may be connected to the pawl and configured to rotate relative to the pawl about a third axis. The trigger catch may be configured to engage the pawl concavity to inhibit rotation of the pawl about the first axis. The trigger catch may be configured to disengage the pawl concavity and to allow rotation of the pawl about the first axis.

17 Claims, 8 Drawing Sheets

(56) References Cited

U.S. PATENT DOCUMENTS

2018/0168061 A1* 6/2018 Liao .................. G06F 1/181
2020/0061800 A1* 2/2020 Wu ..................... B25G 3/08

* cited by examiner

EJECTOR FOR FIELD REPLACEABLE MODULE

TECHNICAL FIELD

The present disclosure relates generally to line card ejectors.

BACKGROUND

Network infrastructures include servers and routers. The servers and routers may comprise a system chassis. A plurality of line cards may be installed in the system chassis. The system chassis and the plurality of line cards may each comprise a plurality of connection points.

Modular electronic systems are designed to provide flexibility to configure systems per user needs. These systems typically have multiple slots to accommodate a variety of modules (e.g., line cards, service cards, fabric cards, and the like). Most of these modules may be replaced with the latest product upgrades without disturbing normal operation of the system (i.e., hot swappable). As power consumption and networking requirements increase, the relationship of interconnect and mechanical assembly grows more complex. Accordingly, it may be important for the modules to be easily removed for replacement or repair.

BRIEF DESCRIPTION OF THE FIGURES

The accompanying drawings, which are incorporated in and constitute a part of this disclosure, illustrate various embodiments of the present disclosure. In the drawings.

DETAILED DESCRIPTION

Overview

Figure 1:
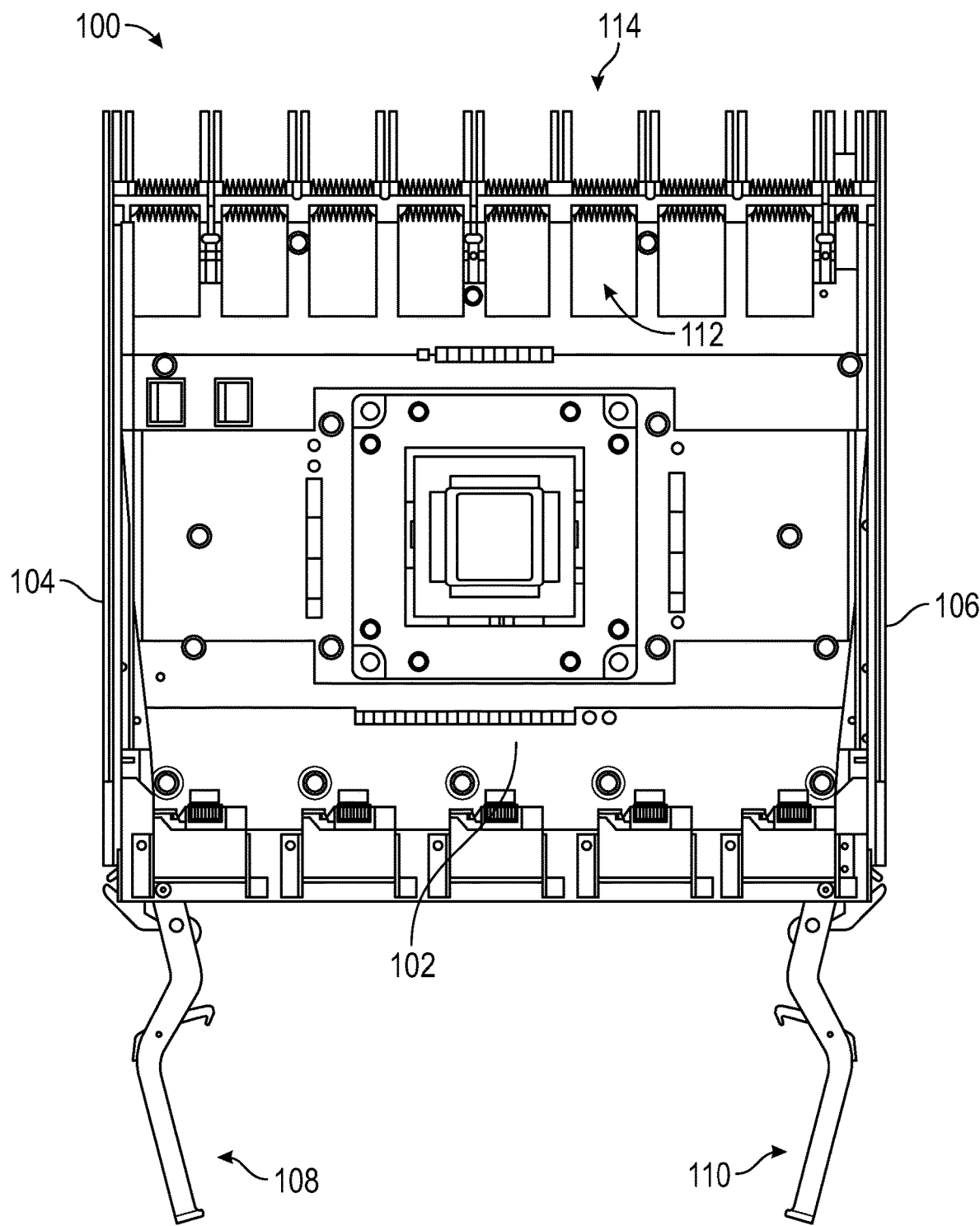
FIG. 1 shows an operating environment for illustrating ejectors for field replaceable modules.

An ejector may be provided. The ejector may comprise a pawl, a trigger, and a handle. The pawl may be configured to rotate relative to a line card about a first axis. The pawl may comprise a pawl concavity. The trigger may be configured to rotate relative to the line card about a second axis. The trigger may comprise a trigger catch and a trigger lever. The trigger catch may be configured to engage the pawl concavity. The handle may be connected to the pawl and configured to rotate relative to the pawl about a third axis. The trigger catch may be configured to engage the pawl concavity to inhibit rotation of the pawl about the first axis when the handle is rotated to an open position to remove the line card from a chassis. The trigger catch may be configured to disengage the pawl concavity and to allow rotation of the pawl about the first axis when the trigger lever engages a wall of the chassis when the line card is installed in the chassis.

Both the foregoing overview and the following example embodiments are examples and explanatory only and should not be considered to restrict the disclosure's scope, as described and claimed. Furthermore, features and/or variations may be provided in addition to those described. For example, embodiments of the disclosure may be directed to various feature combinations and sub-combinations described in the example embodiments.

Example Embodiments

The following detailed description refers to the accompanying drawings. Wherever possible, the same reference numbers are used in the drawings and the following description to refer to the same or similar elements. While embodiments of the disclosure may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description does not limit the disclosure. Instead, the proper scope of the disclosure is defined by the appended claims.

Ejector systems consistent with embodiments of the disclosure may provide a release lever to achieve user safety during installation operation and to provide accurate alignment for multiple connector engagements with a high insertion force. In addition, embodiments of the disclosure may include a release lever that may allow an ejector arm to maintain no rotation at an open position, which may prevent a user's fingers from being pinched if the ejector arm was allowed to rotate freely.

Moreover, embodiments of the disclosure may allow the user to grip the ejectors arms while pushing the line card with even force to help avoid a rocking effect on the line card in order to minimize potential uneven connector engagement. The final connector mating may occur when a trigger lever is triggered. An audible "click" sound may signal to the user a time to begin to rotate the ejector arm, thus lowering the chance for premature injection.

FIG. 1 shows an operating environment for illustrating ejectors for field replaceable modules. As shown in FIG. 1, the operating environment may comprise a chassis 100 and a line card 102. Chassis 100 may comprise a first wall 104 and a second wall 106. Line card 102 may comprise a first ejector 108 and a second ejector 110. As described in greater detail below, first ejector 108 and second ejector 110 may provide a user a steady and smooth alignment of line card connectors 112 associated with line card 102 and chassis connectors 114 associated with chassis 100 during installation of line card 102 in chassis 100. Furthermore, first ejector 108 and second ejector 110 may aid in avoiding an unlevel insertion/injection that may otherwise cause bent pin issues with line card connectors 112 and chassis connectors 114.

Embodiments of the disclosure may operate in the context of a data communications network including multiple network devices. The network may include any number of network devices in communication via any number of nodes (e.g., routers, switches, gateways, controllers, edge devices, access devices, aggregation devices, core nodes, intermediate nodes, or other network devices), which facilitate passage of data within the network. The network devices may communicate over one or more networks (e.g., a Local Area Network (LAN), a Metropolitan Area Network (MAN), a Wide Area Network (WAN), a Virtual Private Network (VPN) (e.g., an Ethernet Virtual Private Network (EVPN), a Layer 2 Virtual Private Network (L2VPN)), a Virtual Local Area Network (VLAN), a wireless network, an enterprise network, a corporate network, a data center, Internet, an intranet, a radio access network, a public switched network, or any other network). One or more of the network devices may comprise a modular electronic system comprising a line card ejector system as described herein. The network device may include one or more processors, memories, and network interfaces. One or more of these components may be located on a line card removably inserted into the network device.

A line card (e.g., line card 102) may comprise any modular electronic component, field replaceable unit, service card, line card, fabric card, or other card, component, or module configured for insertion and removal from a network device. For example, line card 102 may comprise, but is not limited to, a fabric card, a service card, a combo card, a controller card, a processor card, a high density line card, and a high power line card. Notwithstanding card 102 may comprise many types of field replaceable electronic units that may slide in or out of chassis 100.

Chassis 100 may include one or more frames or structures (e.g., first wall 104 and second wall 106) configured to support components and slidably receive any number of removable modules (e.g., line cards). Chassis 100's frame may be formed from any suitable material including, for example, aluminum, steel, or any other metal, non-metal, or composite material. Consistent with embodiments of the disclosure, chassis 100 may include any number of slots for receiving any number or type of removable modules (e.g., line cards) arranged in any format (e.g., positioned horizontally or vertically).

Figure 2A:
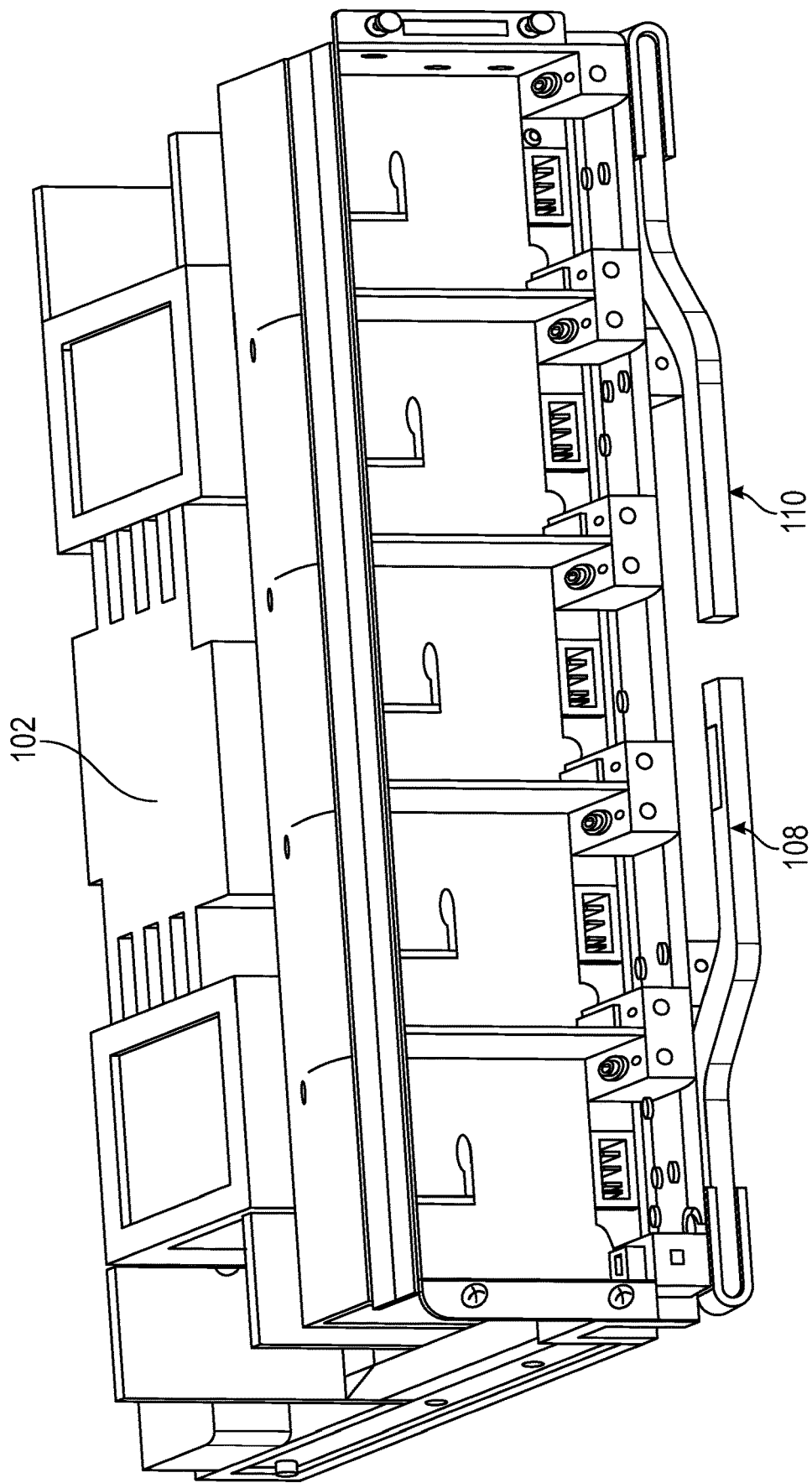
FIG. 2A and FIG. 2B show various views of a line card with its first ejector and second ejector in a closed position.
Figure 2B:
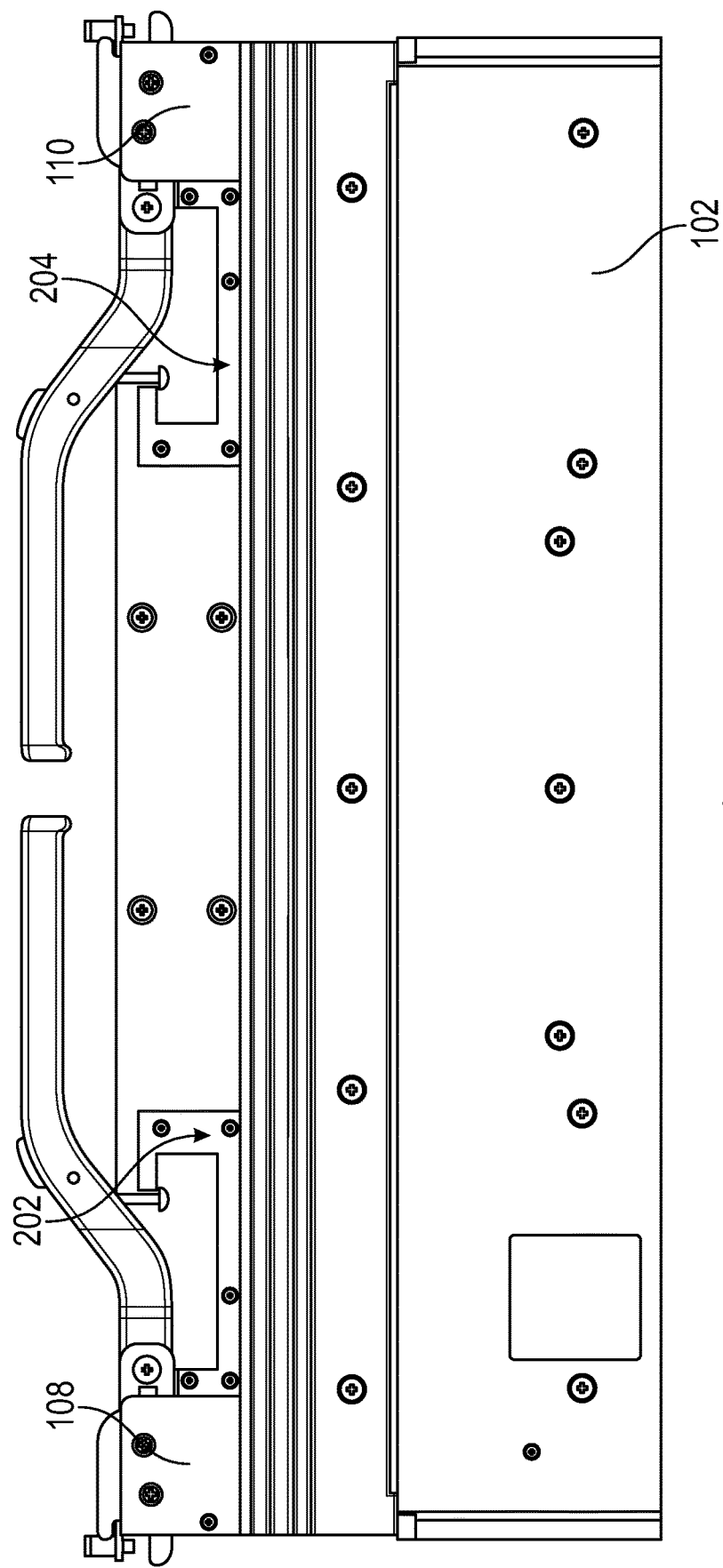

FIG. 2A and FIG. 2B show various views of line card 102 with its first ejector 108 and second ejector 110 in a closed position. As shown in FIG. 2A and as described in greater detail below, the handles of first ejector 108 and second ejector 110 may be serpentine in shape and may provide a space between the handles and line card 102 when first ejector 108 and second ejector 110 are in a closed position. This may allow a user who may be operating the handles to place them in a closed position without pinching or injuring their fingers between the handles and line card 102. As shown in FIG. 2B, line card 102 may comprise a first bracket 202 and a second bracket 204. As described in greater detail below, a lock on each of the handles may respectively engage first bracket 202 and second bracket 204 in order to retain the handles and their respective ejectors in a closed position.

Figure 3:
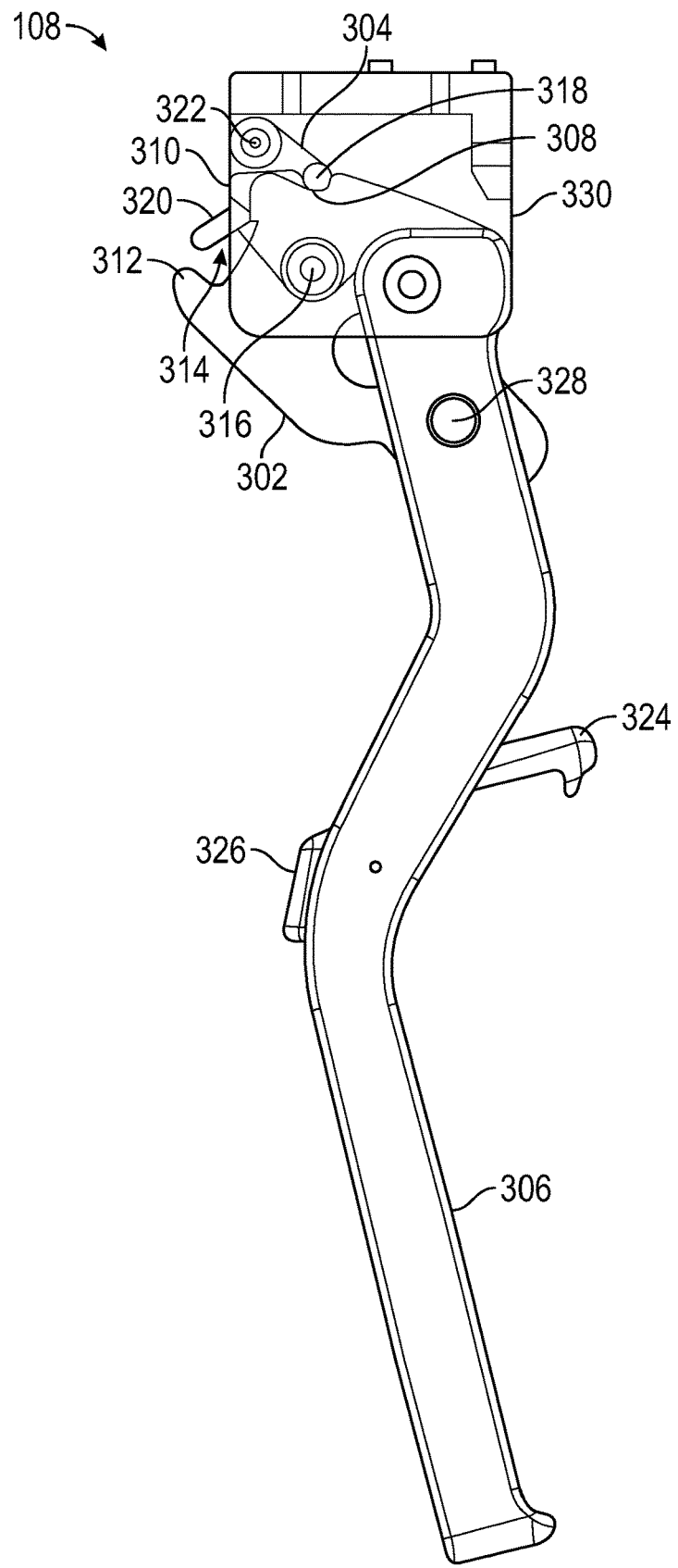
FIG. 3 shows a first ejector in greater detail.

FIG. 3 shows first ejector 108 in greater detail. As shown in FIG. 3, first ejector 108 may comprise a pawl 302, a trigger 304, and a handle 306. Pawl 302 may comprise a pawl concavity 308, a first tooth 310, a second tooth 312, and an opening 314. Pawl 302 may be configured to rotate relative to line card 102 about a first axis 316. Trigger 304 may comprise a trigger catch 318 and a trigger lever 320. Trigger lever 320 may extend into opening 314 between first tooth 310 and second tooth 312 when line card 102 is not in chassis 100. Trigger 304 may be configured to rotate relative to line card 102 about a second axis 322. Handle 306 may comprise lock 324, release 326, and third axis 328. A housing 330 may contain some elements of first ejector 108. Second ejector 110 may be similar to first ejector 108 and may comprise a "right-hand" version of first ejector 108 that may comprise a "left-hand version".

The example of FIG. 3 illustrates first ejector 108 in the fully open position. In the fully open position, pawl 302 may be locked and unable to rotate. For example, trigger catch 318 may be configured to engage pawl concavity 308 to inhibit the rotation of pawl 302 about first axis 316 when first ejector 108 is in the fully open position, for example, when it is rotated to an open position to remove line card 102 from chassis 100. Furthermore, trigger catch 318 may be configured to disengage pawl concavity 308 and to allow rotation of pawl 302 about first axis 316 when trigger lever 320 engages a wall (i.e., first wall 104) of chassis 100 when line card 102 is being installed in chassis 100.

Figure 4A:
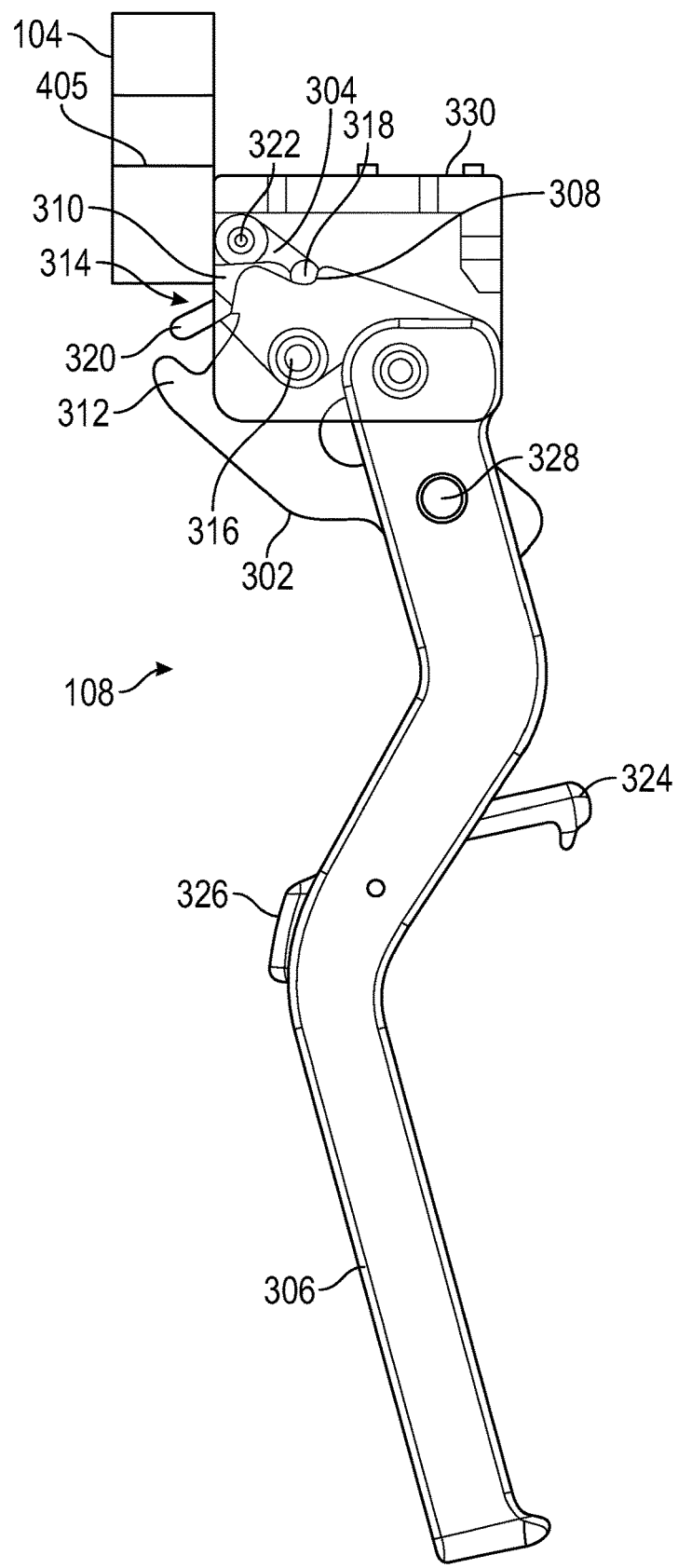
FIG. 4A, FIG. 4B, and FIG. 4C illustrate the operation of a first ejector as a line card is being installed in a chassis.
Figure 4B:
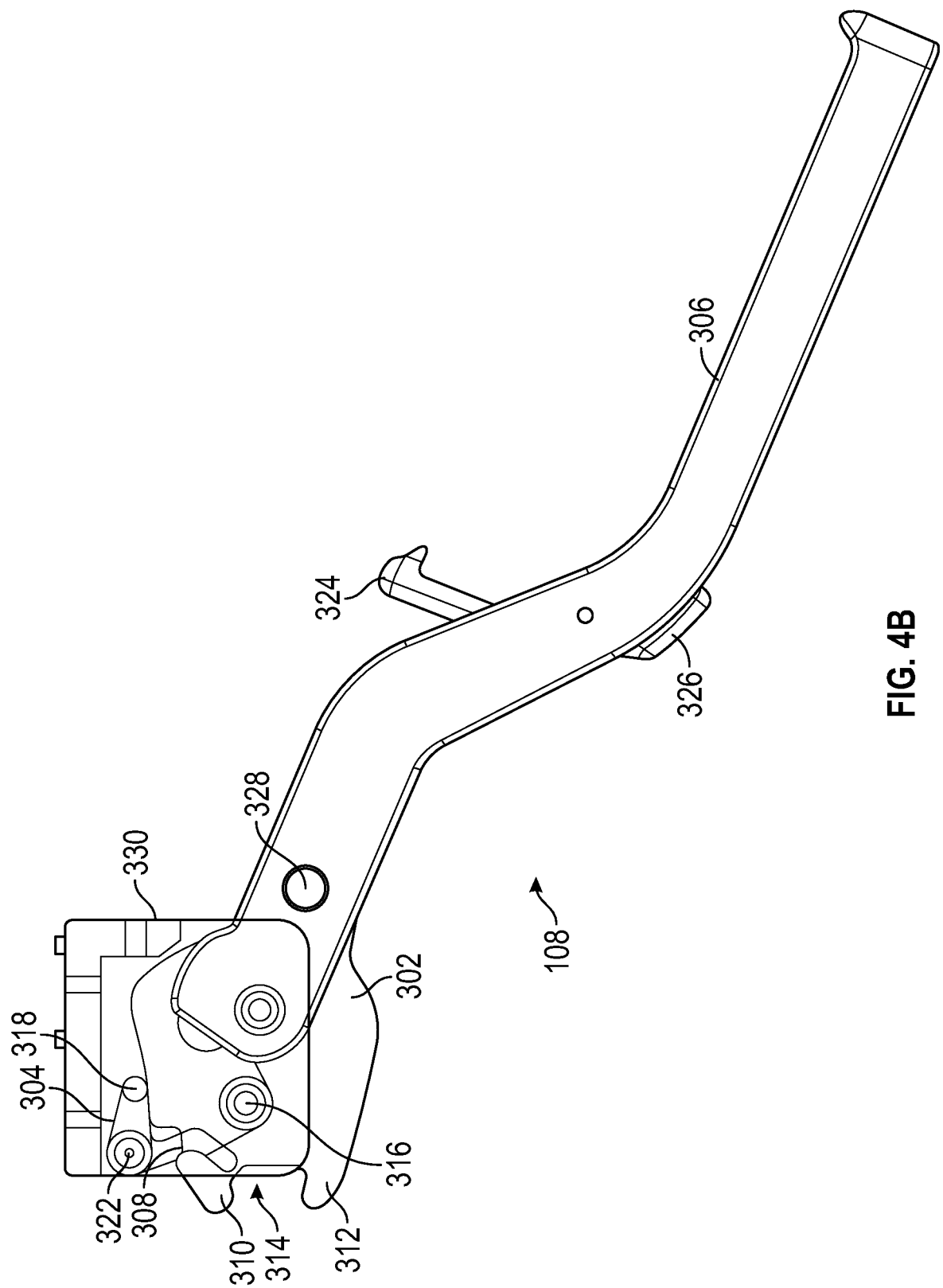
Figure 4C:
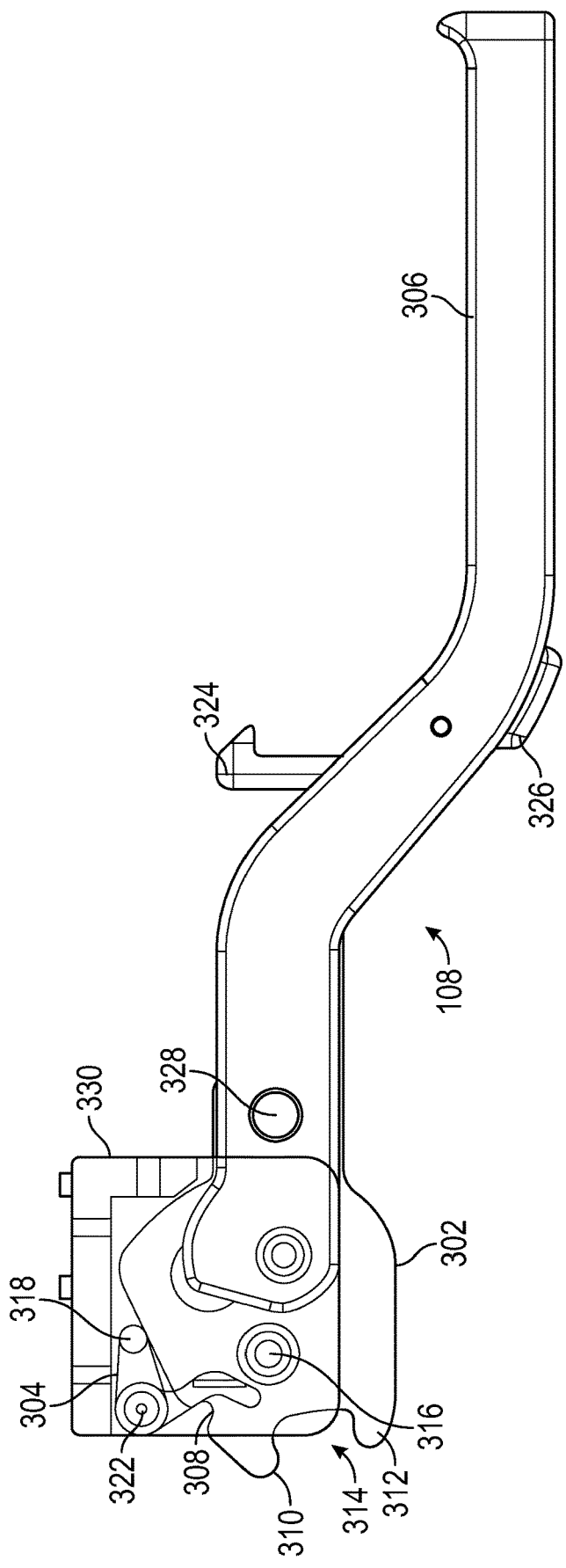

FIG. 4A, FIG. 4B, and FIG. 4C illustrate the operation of first ejector 108 as line card 102 is being installed in chassis 100. As shown in FIG. 4A, pawl 302 may be locked and unable to rotate. For example, trigger catch 318 may be configured to engage pawl concavity 308 to inhibit the rotation of pawl 302 about first axis 316 when first ejector 108 is in the fully open position as shown in FIG. 4A. A user may take a handle (i.e., handle 306) of first ejector 108 with the user's left hand and the user may take a handle of second ejector 110 with the user's right hand and slide line card 102 into chassis 100.

As line card 102 slides, trigger lever 320 eventually engages first wall 104 of chassis 100. This engagement pushes trigger lever 320 into opening 314 thus rotating trigger 304 about second axis 322 as illustrated by FIG. 4B. This rotation about second axis 322 lifts trigger catch 318 out of pawl concavity 308. With pawl concavity 308 free of trigger catch 318, pawl 302 is free to rotate about first axis 316 due to the rotational force placed by the user on handle 306 as the user begins to close handle 306 as illustrated by FIG. 4B. The user may continue the rotational force on handle 306 until first ejector 108 is in the fully closed position as shown in FIG. 4C. Consistent with embodiments of the disclosure, the operation described above with respect to FIG. 4A, FIG. 4B, and FIG. 4C may be reversed thus removing line card 102 from chassis 100.

Figure 5:
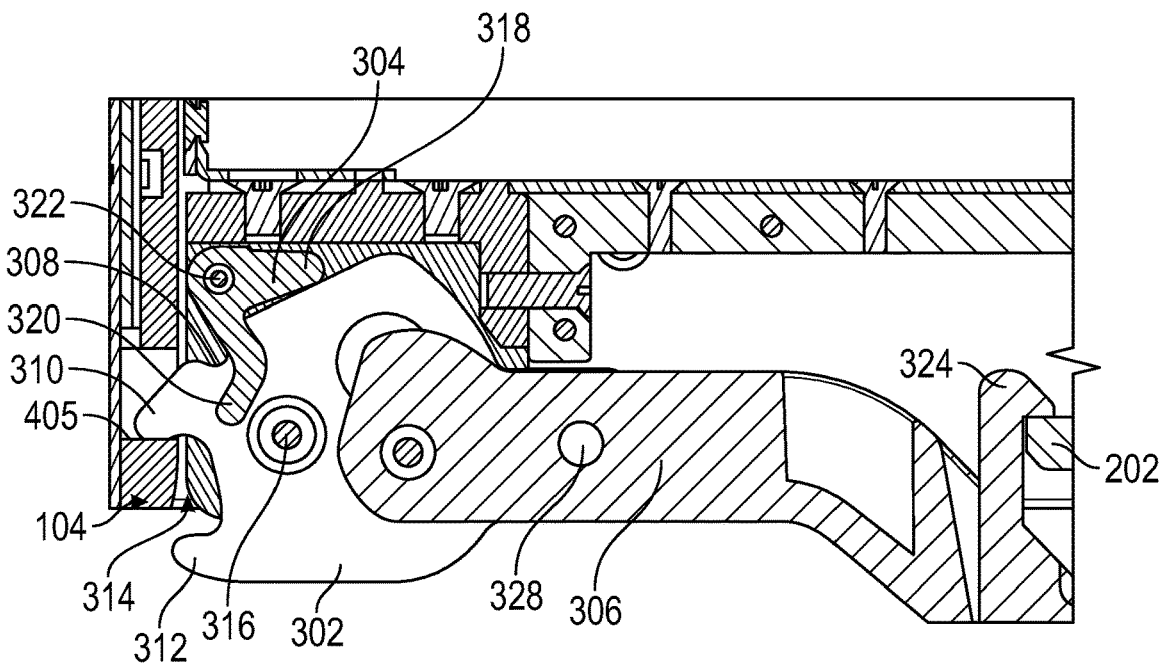
FIG. 5 illustrates a first ejector in the fully closed position with line card installed in a chassis.

FIG. 5 illustrates first ejector 108 in the fully closed position with line card 102 installed in chassis 100. FIG. 5 is similar to FIG. 4A, however FIG. 5 shows the interaction of first ejector 108 with chassis 100 and line card 102. As show in FIG. 5, first tooth 310 may engage inside surface 405 of first wall 104 of chassis 100 when line card 102 is installed in chassis 100. In other words, first tooth 310 may engage inside surface 405 as pawl 302 rotate about first axis 316 due to the rotational force placed by the user on handle 306 as the user begins to close handle 306. At this point line card connectors 112 associated with line card 102 and chassis connectors 114 associated with chassis 100 may begin to align. The user may continue the rotational force on handle 306 until first ejector 108 is in the fully closed position and line card connectors 112 associated with line card 102 and chassis connectors 114 associated with chassis 100 are mated and connected. The user may close second ejector 110 simultaneously with the closing of first ejector 108 thus avoiding unlevel insertion that may otherwise cause bent pin issues with line card connectors 112 and chassis connectors 114.

An audible sound (e.g., a "click") may be produced when trigger lever 320 engages first wall 104 of chassis 100 when line card 102 is installed in chassis 100. Similarly, an audible sound (e.g., a "click") may be produced when the trigger lever of second ejector 110 engages second wall 106 of chassis 100 when line card 102 is installed in chassis 100. Consistent with embodiments of the disclosure, the audible sound produced by first ejector 108 and the audible sound produced by second ejector 110 may be substantially simultaneous.

When first ejector 108 is in the fully closed position, lock 324 may retain handle 306 when line card 102 is installed in chassis 100. When handle 306 is in the closed position, lock may engage first bracket 202 on line card 102, which may retain handle 306. When the user actuates release 326, handle 306 may be unlocked from line card 102 and line card 102 may be removed by reversing the aforementioned process. The handles of first ejector 108 and second ejector 110 may be serpentine in shape and may provide a space between the handles and line card 102 when first ejector 108 and second ejector 110 are in a closed position. This may allow the user who may be operating the handles to place the handles in a closed position without injury (e.g., without pinching the user's fingers between the handles and line card 102).

Figure 6:
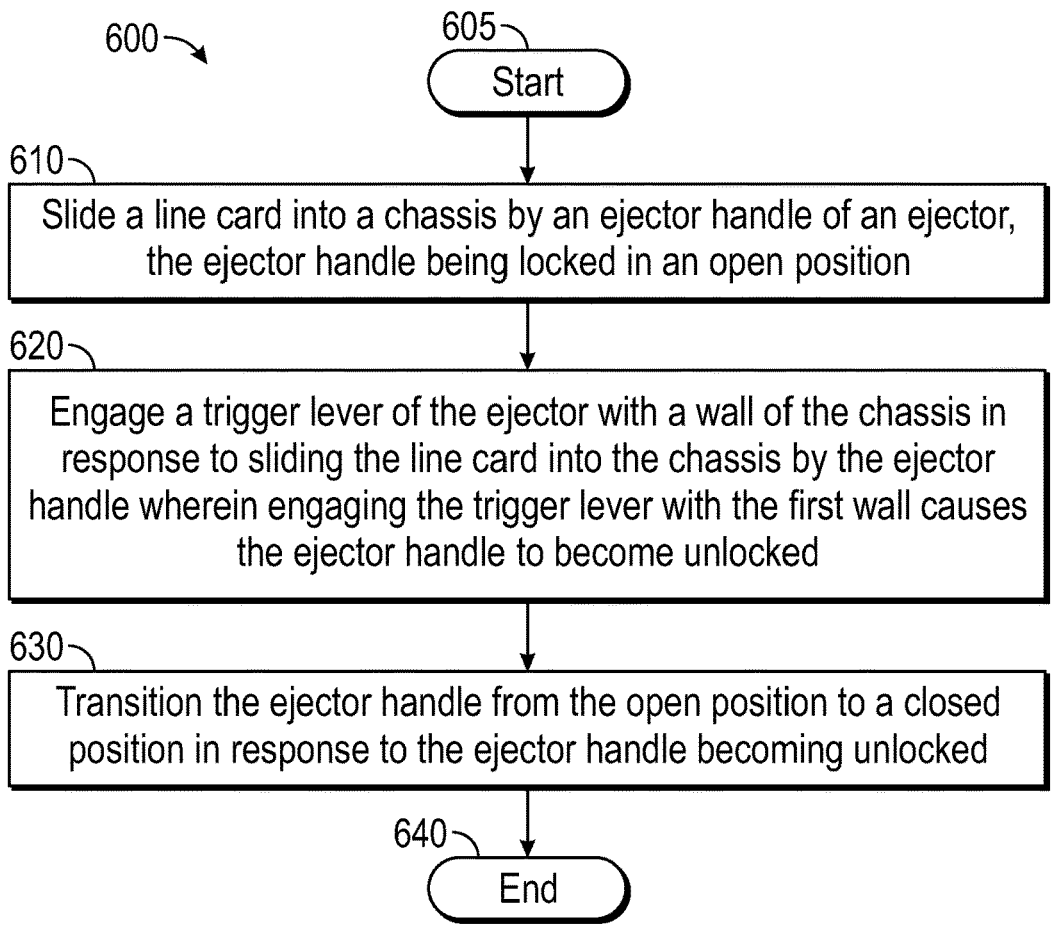
FIG. 6 is a flow chart setting forth the general stages involved in a method for providing line card ejectors.

FIG. 6 is a flow chart setting forth the general stages involved in a method 600 consistent with embodiments of the disclosure for providing line card ejectors. Method 600 may be implemented by a user as described in more detail above. Ways to implement the stages of method 600 will be described in greater detail below.

Method 600 may begin at starting block 605 and proceed to stage 610 where a user may slide line card 102 into chassis 100 by handle 306 of first ejector 108. Handle 306 may be locked in the fully open position as shown in FIG. 3. In the fully open position, pawl 302 may be locked and unable to rotate. For example, trigger catch 318 may be configured to engage pawl concavity 308 to inhibit the rotation of pawl 302 about first axis 316 when first ejector 108 is in the fully open position, for example, when it is rotated to an open position to remove line card 102 from chassis 100. Furthermore, trigger catch 318 may be configured to disengage pawl concavity 308 and to allow rotation of pawl 302 about first axis 316 when trigger lever 320 engages a wall (i.e., first wall 104) of chassis 100 when line card 102 is being installed in chassis 100. Also, as shown in FIG. 4A, FIG. 4B, and FIG. 4C, a user may take a handle (i.e., handle 306) of first ejector 108 with the user's left hand and the user may take a handle of second ejector 110 with the user's right hand and slide line card 102 into chassis 100.

From stage 610, where the user slides line card 102 into chassis 100 by handle 306 of first ejector 108, method 600 may advance to stage 620 where the user may engage trigger lever 320 of first ejector 108 with first wall 104 of chassis 100 in response to sliding line card 102 into chassis 100 by handle 306. Engaging trigger lever 320 with first wall 104 may cause handle 306 to become unlocked. For example, as line card 102 slides, trigger lever 320 eventually engages first wall 104 of chassis 100. This engagement pushes trigger lever 320 into opening 314 thus rotating trigger 304 about second axis 322 as illustrated by FIG. 4B. This rotation about second axis 322 lifts trigger catch 318 out of pawl concavity 308. With pawl concavity 308 free of trigger catch 318, pawl 302 is free to rotate about first axis 316 due to the rotational force placed by the user on handle 306 as the user begins to close handle 306 as illustrated by FIG. 4B. The user may continue the rotational force on handle 306 until first ejector 108 is in the fully closed position as shown in FIG. 4C.

After the user engages trigger lever 320 of first ejector 108 with first wall 104 of chassis 100 in response to sliding line card 102 into chassis 100 by handle 306 in stage 620, method 600 may continue to stage 630 where the user may transition handle 306 from the open position to a closed position in response to handle 306 becoming unlocked. For example, as show in FIG. 5, first tooth 310 may engage inside surface 405 of first wall 104 of the chassis 100 when line card 102 is installed in chassis 100. In other words, first tooth 310 may engage inside surface 405 as pawl 302 rotate about first axis 316 due to the rotational force placed by the user on handle 306 as the user begins to close handle 306. At this point line card connectors 112 associated with line card 102 and chassis connectors 114 associated with chassis 100 may begin to align. The user may continue the rotational force on handle 306 until first ejector 108 is in the fully closed position and line card connectors 112 associated with line card 102 and chassis connectors 114 associated with chassis 100 may be mated and connected. The user may close second ejector 110 simultaneously with the closing of first ejector 108 thus avoiding unlevel insertion that may otherwise cause bent pin issues with line card connectors 112 and chassis connectors 114.

Once the user transitions handle 306 from the open position to a closed position in response to handle 306 becoming unlocked in stage 630, method 600 may then end at stage 640. Consistent with embodiments of the disclosure, the stages described above with respect to FIG. 6 may be reversed thus removing line card 102 from chassis 100.

Embodiment of the disclosure may comprise a system comprising an ejector. The system may comprise a pawl configured to rotate relative to a line card about a first axis, the pawl comprising a pawl concavity; a trigger configured to rotate relative to the line card about a second axis, the trigger comprising a trigger catch and a trigger lever, wherein the trigger catch is configured to engage the pawl concavity; and a handle connected to the pawl and configured to rotate relative to the pawl about a third axis, wherein the trigger catch is configured to engage the pawl concavity to inhibit rotation of the pawl about the first axis when the handle is rotated to an open position to remove the line card from a chassis, wherein the trigger catch is configured to disengage the pawl concavity and to allow rotation of the pawl about the first axis when the trigger lever engages a wall of the chassis when the line card is installed in the chassis. The system may further include wherein the pawl further comprises a first tooth, a second tooth, and an opening between the first tooth and the second tooth. The system may further include wherein the trigger lever extends into the opening between the first tooth and the second tooth when the line card is not in the chassis. The system may further include wherein the first tooth engages an inside surface of the wall of the chassis when the line card is installed in the chassis. The system may further include wherein the handle further comprises a lock that retains the handle when the line card is installed in the chassis and the handle is in a closed position. The system may further include wherein the lock engages a bracket on the line card when the handle is in the closed position. The system may further include wherein the lock further comprises a release configured to unlock the handle then the release is actuated. The system may further include wherein the handle comprises a serpentine shape. The system may further comprise a space between the handle and the line card when the handle is in a closed position. The system may further include wherein the system provides an audible sound when the trigger lever engages the wall of the chassis when the line card is installed in the chassis. The system may further include wherein the line card comprises one of the following: a fabric card, a service card, a combo card, a controller card, a processor card, a high density line card, and a high power line card.

Embodiments of the disclosure may comprise a system comprising a first ejector and a second ejector. The first ejector is disposed on a line card, the first ejector comprising; a first ejector pawl configured to rotate relative to a line card about a first ejector first axis, the first ejector pawl comprising a first ejector pawl concavity, a first ejector trigger configured to rotate relative to the line card about a first ejector second axis, the first ejector trigger comprising a first ejector trigger catch and a first ejector trigger lever, wherein the first ejector trigger catch is configured to engage the first ejector pawl concavity, and a first ejector handle connected to the first ejector pawl and configured to rotate relative to the first ejector pawl about a first ejector third axis, wherein the first ejector trigger catch is configured to engage the first ejector pawl concavity to inhibit rotation of the first ejector pawl about the first ejector first axis when the first ejector handle is rotated to a first ejector open position to remove the line card from a chassis, wherein the first ejector trigger catch is configured to disengage the first ejector pawl concavity and to allow rotation of the first ejector pawl about the first ejector first axis when the first ejector trigger lever engages a first wall of the chassis when the line card is installed in the chassis. The second ejector is disposed on the line card, the second ejector comprising; a second ejector pawl configured to rotate relative to the line card about a second ejector first axis, the second ejector pawl comprising a second ejector pawl concavity, a second ejector trigger configured to rotate relative to the line card about a second ejector second axis, the second ejector trigger comprising a second ejector trigger catch and a second ejector trigger lever, wherein the second ejector trigger catch is configured to engage the second ejector pawl concavity, and a second ejector handle connected to the second ejector pawl and configured to rotate relative to the second ejector pawl about a second ejector third axis, wherein the second ejector trigger catch is configured to engage the second ejector pawl concavity to inhibit rotation of the second ejector pawl about the second ejector first axis when the second ejector handle is rotated to a second ejector open position to remove the line card from a chassis, wherein the second ejector trigger catch is configured to disengage the second ejector pawl concavity and to allow rotation of the second ejector pawl about the second ejector first axis when the second ejector trigger lever engages a second wall of the chassis when the line card is installed in the chassis. The system may further include wherein the first ejector pawl further comprises a first ejector first tooth, a first ejector second tooth, and a first ejector opening between the first ejector first tooth and the first ejector second tooth and wherein the second ejector pawl further comprises a second ejector first tooth, a second ejector second tooth, and a second ejector opening between the second ejector first tooth and the second ejector second tooth. The system may further include wherein the first ejector trigger lever extends into the first ejector opening between the first ejector first tooth and the first ejector second tooth when the line card is not in the chassis and wherein the second ejector trigger lever extends into the second ejector opening between the second ejector first tooth and the second ejector second tooth when the line card is not in the chassis. The system may further include wherein the first ejector first tooth engages a first inside surface of the first wall of the chassis when the line card is installed in the chassis and wherein the second ejector first tooth engages a second inside surface of the second wall of the chassis when the line card is installed in the chassis. The system may further include wherein the system provides a first audible sound when the first ejector trigger lever engages the first wall of the chassis when the line card is installed in the chassis and wherein the system provides a second audible sound when the second ejector trigger lever engages the second wall of the chassis when the line card is installed in the chassis wherein the first audible sound and the second audible sound are provided substantially simultaneously. The line card may comprise one of the following: a fabric card, a service card, a combo card, a controller card, a processor card, a high density line card, and a high power line card.

Embodiments of the disclosure may comprise a method comprising: sliding a line card into a chassis by a handle of an ejector, the handle being locked in an open position; engaging a trigger lever of the ejector with a wall of the chassis in response to sliding the line card into the chassis by the handle wherein engaging the trigger lever with the first wall causes the handle to become unlocked; and transitioning the handle from the open position to a closed position in response to the handle becoming unlocked. The method may further include wherein an audible sound is caused when the trigger lever engages the wall of the chassis. The method may further include wherein the line card comprises one of the following: a fabric card, a service card, a combo card, a controller card, a processor card, a high density line card, and a high power line card.

Embodiments of the present disclosure, for example, are described above with reference to block diagrams and/or operational illustrations of methods, systems, and computer program products according to embodiments of the disclosure. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved.

While the specification includes examples, the disclosure's scope is indicated by the following claims. Furthermore, while the specification has been described in language specific to structural features and/or methodological acts, the claims are not limited to the features or acts described above. Rather, the specific features and acts described above are disclosed as example for embodiments of the disclosure.

The invention claimed is:
1. A system comprising:
a pawl configured to rotate relative to a line card about a first axis, the pawl comprising a pawl concavity;
a trigger configured to rotate relative to the line card about a second axis, the trigger comprising a trigger catch and a trigger lever, wherein the trigger catch is configured to engage the pawl concavity; and
a handle connected to the pawl and configured to rotate relative to the pawl about a third axis,
wherein the trigger catch is configured to engage the pawl concavity to inhibit rotation of the pawl about the first axis when the handle is rotated to an open position to remove the line card from a chassis,
wherein the trigger catch is configured to disengage the pawl concavity and to allow rotation of the pawl about the first axis when the trigger lever engages a wall of the chassis when the line card is installed in the chassis.

2. The system of claim 1, wherein the pawl further comprises a first tooth, a second tooth, and an opening between the first tooth and the second tooth.

3. The system of claim 2, wherein the trigger lever extends into the opening between the first tooth and the second tooth when the line card is not in the chassis.

4. The system of claim 2, wherein the first tooth engages an inside surface of the wall of the chassis when the line card is installed in the chassis.

5. The system of claim 1, wherein the handle further comprises a lock that retains the handle when the line card is installed in the chassis and the handle is in a closed position.

6. The system of claim 5, wherein the lock engages a bracket on the line card when the handle is in the closed position.

7. The system of claim 5, wherein the lock further comprises a release configured to unlock the handle then the release is actuated.

8. The system of claim 1, wherein the handle comprises a serpentine shape.

9. The system of claim 1, further comprising a space between the handle and the line card when the handle is in a closed position.

10. The system of claim 1, wherein the system provides an audible sound when the trigger lever engages the wall of the chassis when the line card is installed in the chassis.

11. The system of claim 1, wherein the line card comprises at least one of the following: a fabric card, a service card, a combo card, a controller card, a processor card, a high density line card, and a high power line card.

12. A system comprising:
   a first ejector disposed on a line card, the first ejector comprising;
      a first ejector pawl configured to rotate relative to the line card about a first ejector first axis, the first ejector pawl comprising a first ejector pawl concavity,
      a first ejector trigger configured to rotate relative to the line card about a first ejector second axis, the first ejector trigger comprising a first ejector trigger catch and a first ejector trigger lever, wherein the first ejector trigger catch is configured to engage the first ejector pawl concavity, and
      a first ejector handle connected to the first ejector pawl and configured to rotate relative to the first ejector pawl about a first ejector third axis,
      wherein the first ejector trigger catch is configured to engage the first ejector pawl concavity to inhibit rotation of the first ejector pawl about the first ejector first axis when the first ejector handle is rotated to a first ejector open position to remove the line card from a chassis,
      wherein the first ejector trigger catch is configured to disengage the first ejector pawl concavity and to allow rotation of the first ejector pawl about the first ejector first axis when the first ejector trigger lever engages a first wall of the chassis when the line card is installed in the chassis; and
   a second ejector disposed on the line card, the second ejector comprising;
      a second ejector pawl configured to rotate relative to the line card about a second ejector first axis, the second ejector pawl comprising a second ejector pawl concavity,
      a second ejector trigger configured to rotate relative to the line card about a second ejector second axis, the second ejector trigger comprising a second ejector trigger catch and a second ejector trigger lever, wherein the second ejector trigger catch is configured to engage the second ejector pawl concavity, and
      a second ejector handle connected to the second ejector pawl and configured to rotate relative to the second ejector pawl about a second ejector third axis,
      wherein the second ejector trigger catch is configured to engage the second ejector pawl concavity to inhibit rotation of the second ejector pawl about the second ejector first axis when the second ejector handle is rotated to a second ejector open position to remove the line card from a chassis,
      wherein the second ejector trigger catch is configured to disengage the second ejector pawl concavity and to allow rotation of the second ejector pawl about the second ejector first axis when the second ejector trigger lever engages a second wall of the chassis when the line card is installed in the chassis.

13. The system of claim 12, wherein the first ejector pawl further comprises a first ejector first tooth, a first ejector second tooth, and a first ejector opening between the first ejector first tooth and the first ejector second tooth and wherein the second ejector pawl further comprises a second ejector first tooth, a second ejector second tooth, and a second ejector opening between the second ejector first tooth and the second ejector second tooth.

14. The system of claim 13, wherein the first ejector trigger lever extends into the first ejector opening between the first ejector first tooth and the first ejector second tooth when the line card is not in the chassis and wherein the second ejector trigger lever extends into the second ejector opening between the second ejector first tooth and the second ejector second tooth when the line card is not in the chassis.

15. The system of claim 13, wherein the first ejector first tooth engages a first inside surface of the first wall of the chassis when the line card is installed in the chassis and wherein the second ejector first tooth engages a second inside surface of the second wall of the chassis when the line card is installed in the chassis.

16. The system of claim 12, wherein the system provides a first audible sound when the first ejector trigger lever engages the first wall of the chassis when the line card is installed in the chassis and wherein the system provides a second audible sound when the second ejector trigger lever engages the second wall of the chassis when the line card is installed in the chassis wherein the first audible sound and the second audible sound are provided substantially simultaneously.

17. The system of claim 12, wherein the line card comprises at least one of the following: a fabric card, a service card, a combo card, a controller card, a processor card, a high density line card, and a high power line card.

* * * * *